United States Patent
Fujita et al.

(10) Patent No.: US 8,709,328 B2
(45) Date of Patent: Apr. 29, 2014

(54) METHOD FOR FORMING VENTILATION HOLES IN AN ELECTRODE PLATE

(75) Inventors: Satoshi Fujita, Kobe (JP); Atsushi Matsuda, Sanda (JP)

(73) Assignee: Mitsubishi Materials Corporation, Tokyo (JP)

( * ) Notice: Subject to any disclaimer, the term of this patent is extended or adjusted under 35 U.S.C. 154(b) by 134 days.

(21) Appl. No.: 13/393,582

(22) PCT Filed: Oct. 6, 2010

(86) PCT No.: PCT/JP2010/067528
§ 371 (c)(1),
(2), (4) Date: Mar. 1, 2012

(87) PCT Pub. No.: WO2011/046052
PCT Pub. Date: Apr. 21, 2011

(65) Prior Publication Data
US 2012/0187605 A1    Jul. 26, 2012

(30) Foreign Application Priority Data
Oct. 13, 2009   (JP) ................................. 2009-236694

(51) Int. Cl.
*B29C 35/08*        (2006.01)
(52) U.S. Cl.
USPC ... 264/400; 264/482; 219/121.7; 219/121.17; 219/121.78
(58) Field of Classification Search
USPC ............. 219/121.7, 121.71, 121.78; 264/154, 264/155, 156, 400, 446, 482
See application file for complete search history.

(56) References Cited

U.S. PATENT DOCUMENTS

| 6,649,864 | B2* | 11/2003 | De Steur et al. ......... 219/121.71 |
| 2002/0063113 | A1 | 5/2002 | Wiggermann et al. |
| 2005/0056218 | A1* | 3/2005 | Sun et al. ...................... 118/715 |
| 2008/0023458 | A1 | 1/2008 | Watanabe |

FOREIGN PATENT DOCUMENTS

| CN | 1433350 A | 7/2003 |
| JP | 09-289195 A | 11/1997 |
| JP | 10-050678 A | 2/1998 |

(Continued)

OTHER PUBLICATIONS

International Search Report dated Jan. 18, 2011, issued for PCT/JP2010/067528.

*Primary Examiner* — Monica Huson
*Assistant Examiner* — Hannuri L Kwon
(74) *Attorney, Agent, or Firm* — Edwards Wildman Palmer LLP

(57) ABSTRACT

This method for forming ventilation holes in an electrode plate includes: a roughening step of roughening a surface of an electrode plate for a plasma processing apparatus such that a center line average roughness Ra becomes in a range of 0.2 μm to 30 μm; and a ventilation hole forming step of irradiating a laser beam having a wavelength within a range of 200 nm to 600 nm on a roughened surface of the electrode plate so as to form ventilation holes in the electrode plate which pass through the electrode plate in a thickness direction, wherein in the ventilation hole forming step, a focus spot of the laser light is swirled along a planar direction of the electrode plate so as to form a circular irradiation area, and while moving the irradiation area along a planar direction of the electrode plate in a circular movement, the focus spot of the laser light is shifted in a thickness direction of the electrode plate.

1 Claim, 3 Drawing Sheets

(56) References Cited

FOREIGN PATENT DOCUMENTS

| JP | 11-092972 A | 4/1999 |
| JP | 2002-283083 A | 10/2002 |
| JP | 2008-055478 A | 3/2008 |
| JP | 2008-181972 A | 8/2008 |

* cited by examiner

METHOD FOR FORMING VENTILATION HOLES IN AN ELECTRODE PLATE

TECHNICAL FIELD

The present invention relates to a method for forming ventilation holes in an electrode plate for a plasma processing apparatus.

The present application claims priority on Japanese Patent Application No. 2009-236694 filed on Oct. 13, 2009, the content of which is incorporated herein by reference.

BACKGROUND ART

A plasma CVD apparatus for forming a thin film on a substrate, an etching apparatus for etching a wafer by plasma when manufacturing a semiconductor integrated circuit, and the like have been widely used as a plasma processing apparatus. The plasma processing apparatus includes a vacuum chamber and an electrode plate disposed in the vacuum chamber. The electrode plate is formed of silicon or silicon carbide (SiC) and has a plurality of ventilation holes passing through the electrode plate in the thickness direction.

When processing a wafer by using the plasma processing apparatus, at first, the wafer is disposed in the vacuum chamber such that the electrode plate and the wafer face each other. Then, gas is supplied between the electrode plate and the wafer via the ventilation holes of the electrode plates. While maintaining this state, a high-frequency voltage is applied to the electrode plate; and thereby, plasma is generated between the wafer and the electrode plate.

In an etching apparatus, plasma is generated between the wafer and the electrode plate while supplying etching gas as the above-mentioned gas; and thereby, it is possible to etch the wafer. Recently, fine patterns are formed on a wafer with a high precision by using the plasma etching apparatus.

Such an electrode plate of a plasma processing apparatus is manufactured by forming through-holes (ventilation holes) with a diameter of 0.1 mm to 0.5 mm in a silicon substrate with a thickness of 4 mm to 5 mm, and the through-holes (ventilation holes) are formed by drilling, for example, as described in Patent Document 1.

In the case where the ventilation holes are formed with a high precision, the plasma processing apparatus including the electrode plate can uniformly supply gas. Accordingly, smoothness and working precision of the inner surfaces of the through-holes (ventilation holes) formed in the electrode plate affect the processing precision (wafer working precision) of the plasma processing apparatus. For example, in the case of a plasma etching apparatus, the working precision of a pattern formed on a wafer or the like is affected.

Patent Document 1 discloses that inner surfaces of through-holes (ventilation holes) are subjected to surface machining by a lapping machine or a polishing machine; and thereby, the ventilation holes with small surface roughness of the inner surfaces are formed.

Patent Document 2 discloses a method for forming through holes which includes a step of forming pilot holes at a relatively high speed by electrical spark machining or laser machining, and a step of machining inner surfaces of the pilot holes at a relatively low speed by using a diamond drill or the like to remove machining-damaged layers formed in the forming of the pilot holes. According to this method for forming through holes, it is possible to efficiently form fine holes with an excellent precision of worked surfaces.

Patent Document 3 discloses a method for forming ventilation holes with a high finishing precision which includes a step of forming pilot holes, and a step of irradiating a picosecond laser beam having a high energy density on inner surfaces of the pilot holes to remove thermally-affected zones formed in the forming of the pilot holes.

As described above, with regard to an electrode plate for a plasma processing apparatus such as a plasma CVD apparatus, an etching apparatus, and the like, in the case where ventilation holes with a high precision are formed therein, it is possible to uniformly supply gas. For example, according to the methods described in Patent Document 2 and Patent Document 3, it is possible to form ventilation holes with the same opening diameter in the front and rear surfaces of the electrode plate. However, it is necessary to conduct two steps, that is, the step of forming the pilot holes and the step of machining the inner surfaces of the pilot holes. Accordingly, there is a need for a machining method with higher productivity.

PRIOR ART DOCUMENT

Patent Document
  Patent Document 1: Japanese Patent Application, First Publication No. H09-289195
  Patent Document 2: Japanese Patent Application, First Publication No. H 11-92972
  Patent Document 3: Japanese Patent Application, First Publication No. 2008-55478

DISCLOSURE OF THE INVENTION

Problems to be Solved by the Invention

The present invention is made in consideration of the above-mentioned situation. The present invention aims to provide a processing method of forming ventilation holes for blowing gas with a good shape precision in an electrode plate for a plasma processing apparatus with high productivity.

Means for Solving the Problems

According to an aspect of the invention, there is provided a method for forming ventilation holes in an electrode plate which includes: a roughening step of roughening a surface of an electrode plate for a plasma processing apparatus such that a center line average roughness Ra becomes in a range of 0.2 µm to 30 µm; and a ventilation hole forming step of irradiating a laser beam having a wavelength within a range of 200 nm to 600 nm on a roughened surface of the electrode plate so as to form ventilation holes in the electrode plate which pass through the electrode plate in a thickness direction, wherein in the ventilation hole forming step, a focus spot of the laser light is swirled along a planar direction of the electrode plate so as to form a circular irradiation area, and while moving the irradiation area along a planar direction of the electrode plate in a circular movement, the focus spot of the laser light is shifted in a thickness direction of the electrode plate.

Here, the center line average roughness Ra is a value calculated as follows. A measured roughness curve is folded from the center line thereof and a total area of regions surrounded with the roughness curve and the center line is calculated. A value (unit: µm) obtained by dividing the total area by a measured length is the center line average roughness Ra. The roughness curve is measured by using a contact type measuring instrument.

In the method for forming ventilation holes in an electrode plate according to the aspect of the invention, an irradiation area having a larger area than that of the focus spot of a laser beam is formed. The irradiation area is spirally moved relative to the electrode plate (spirally moved forward in the thickness direction); and thereby, the electrode plate is spirally perforated. In this way, a ventilation hole having a larger area than that of the focus spot can be formed.

Therefore, it is not necessary to perform the step of forming pilot holes by drilling or the like and it is possible to form ventilation holes by a single step of applying a laser beam. In addition, by roughening a surface of the electrode plate in advance, the electrode plate can absorb the laser beam efficiently in the ventilation hole forming step.

An example of the material of the electrode plate is silicon carbide. It is difficult to process (machine) the electrode plate formed of silicon carbide. Therefore, it was difficult to form ventilation holes in the electrode plate formed of silicon carbide or to perform an etching process of removing a machining-damaged layer in a subsequent step. However, in the aspect of the invention, since a short-wavelength laser beam is used, it is possible to form ventilation holes in the electrode plate formed of silicon carbide. It is also possible to easily form deep holes with a high precision and to form ventilation holes of which the inner surfaces are smooth and which have a small machining-damaged layer. Accordingly, it is possible to skip (omit) the etching process of removing the machining-damaged layer. Therefore, the method for forming ventilation holes in an electrode plate according to the aspect of the invention is particularly useful for the electrode plate formed of silicon carbide in which it is difficult to form ventilation holes or to perform an etching process of removing a machining-damaged layer.

Effects of the Invention

In the method for forming ventilation holes in an electrode plate for a plasma processing apparatus according to the aspect of the invention, it is possible to form ventilation holes having a smooth inner surface and a small machining-damaged layer with a high processing precision. In addition, since the ventilation holes can be formed by a single step without forming pilot holes, it is possible to achieve high productivity.

BEST MODE FOR CARRYING OUT THE INVENTION

Hereinafter, a method for forming ventilation holes in an electrode plate for a plasma processing apparatus according to an embodiment of the invention will be described.

Figure 1:
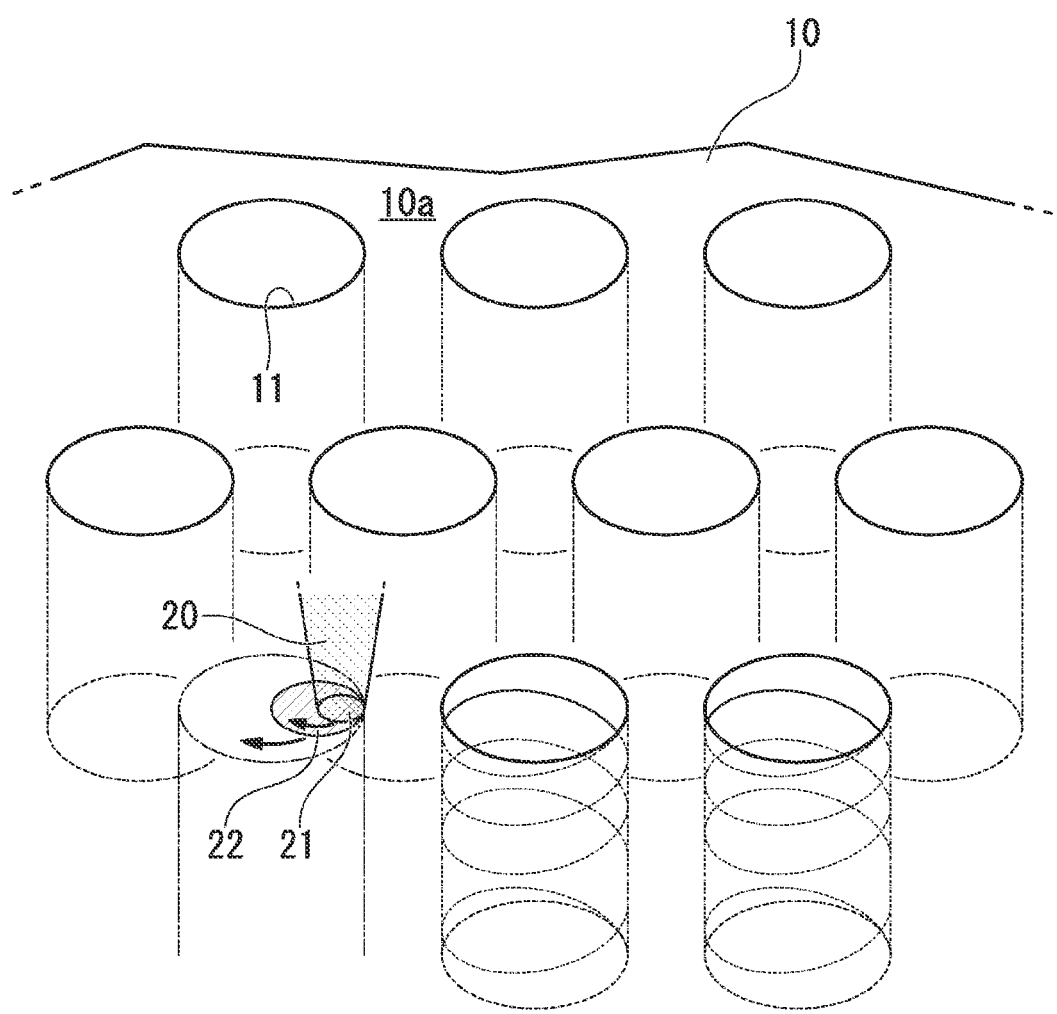
FIG. 1 is a perspective view illustrating a method for forming ventilation holes in an electrode plate for a plasma processing apparatus according to an embodiment of the invention.

The method for forming ventilation holes in an electrode plate according to an embodiment of the invention is a method of forming ventilation holes 11 which pass through an electrode plate 10 for a plasma processing apparatus in the thickness direction as shown in FIG. 1. This method includes a roughening step (FIG. 2) of roughening a surface 10a of the electrode plate 10 such that a center line average roughness Ra becomes in a range of 0.2 μm to 30 μm, and a ventilation hole forming step (FIGS. 1 and 3) of irradiating a laser beam 20 having a wavelength within a range of 200 nm to 600 nm on a roughened surface 10a of the electrode plate 10 so as to form the ventilation holes 11.

An example of the electrode plate 10 is a plate formed of silicon or silicon carbide (SiC). For example, in the case where a silicon carbide disk having a thickness of 10 mm and a diameter of 300 mm is used as the electrode plate 10 and the method for forming ventilation holes according to the embodiment of the invention is applied, several hundreds to thousands of ventilation holes 11 having a diameter of 0.3 mm can be formed which pass through the electrode plate in the thickness direction such that the ventilation holes 11 are vertically and horizontally arranged at intervals of several mm to 10 mm (for example, 8 mm).

The steps will be described below in detail.

(Roughening Step)

Figure 2:
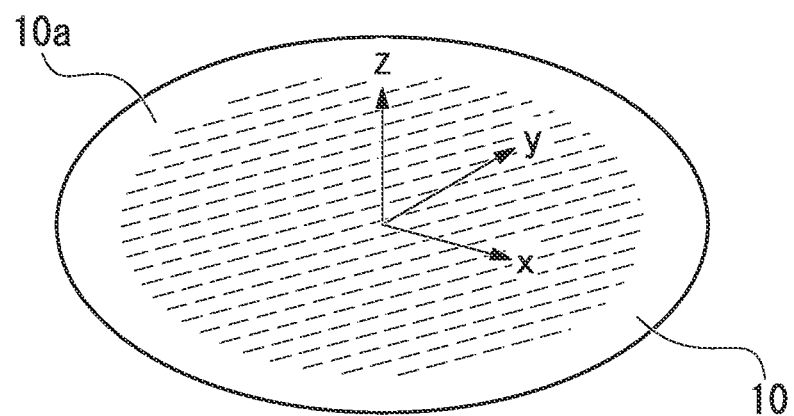
FIG. 2 is a perspective view illustrating a surface of the electrode plate roughened by a roughening step in the method for forming ventilation holes in an electrode plate according to the embodiment of the invention.

In the case where the surface 10a of the electrode plate 10 is mirror-finished, the laser beam 20 is reflected from the surface 10a and is hardly absorbed; and thereby, it is difficult to machine the electrode by using the laser beam 20. Accordingly, at first, the surface 10a of the electrode plate 10 is roughened by a surface grinding machine, a lapping machine, or the like. Specifically, as shown in FIG. 2, the surface 10a of the electrode plate 10 is roughened such that a center line average roughness Ra becomes in a range of 0.2 μm to 30 μm.

Examples of the machining method in the roughening step include grinding by a grindstone, machining by lapping, and machining by a sandpaper.

The machining conditions such as a type or a size of abrasive grains and a machining time are not particularly limited and are appropriately adjusted so as to obtain the target center line average roughness Ra.

By setting the center line average roughness Ra to be in a range of 0.2 μm to 30 μm, it is possible to suppress the reflection of the laser beam 20 and to enhance the absorption efficiency of the laser beam 20; and thereby, laser machinability can be improved.

In the case where the center line average roughness Ra is less than 0.2 μm, the laser machinability cannot be improved satisfactorily. In the case where the center line average roughness Ra is greater than 30 μm, the roughening step requires a long time; and thereby, the productivity is deteriorated. In addition, a decrease in strength of the electrode plate 10 may be caused.

(Ventilation Hole Forming Step)

Next, as shown in FIG. 1, the laser beam 20 is irradiated on the roughened surface 10a of the electrode plate 10 so as to form the ventilation holes 11 in the electrode plate 10 which pass through the electrode plate in the thickness direction.

Figure 3:
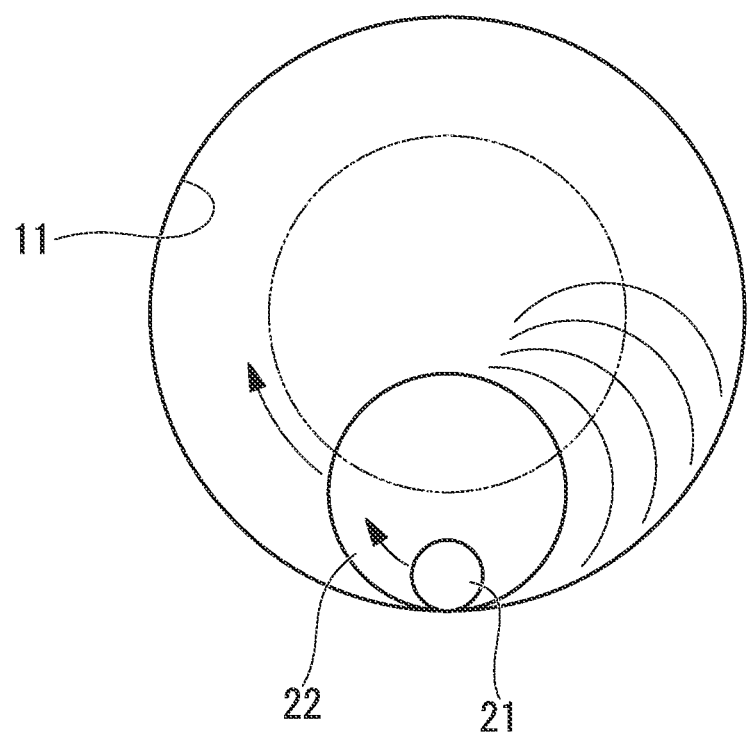
FIG. 3 is a plan view illustrating a focus spot and an irradiation area of a laser beam, and a ventilation hole in the method for forming ventilation holes in an electrode plate according to the embodiment of the invention.
Figure 4:
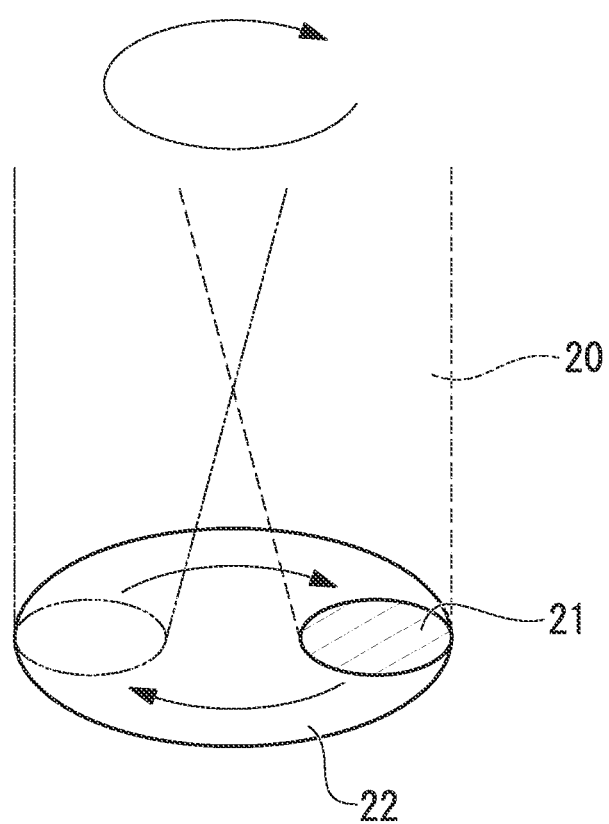
FIG. 4 is a diagram schematically illustrating a laser beam used in the method for forming ventilation holes in an electrode plate according to the embodiment of the invention.

FIG. 3 is a plan view illustrating a focus spot 21 and an irradiation area 22 of the laser beam 20 and a ventilation hole 11 formed therewith. FIG. 4 is a diagram schematically illustrating the state where the irradiation area 22 is formed by the laser beam 20. As shown in FIG. 4, the focus spot 21 of the laser beam 20 is swirled (turned around) along a planar direction (in an in-plane direction) of the electrode plate 10; and thereby, a circular irradiation area 22 is formed. Then, while forming the irradiation area 22, the irradiation area 22 is circularly moved in an in-plane direction (xy direction) of the electrode plate 10 and the focus spot 21 of the laser beam 20 is also moved in a thickness direction (z direction) of the electrode plate 10, as shown in FIG. 3. In the electrode plate 10, a portion which is exposed to the laser beam 20 in the irradiation area 22 is heated, evaporated, and removed by the heat of the laser beam 20. The vapor of the electrode plate 10 is rapidly removed from a vicinity of the irradiation area 22 by a suction unit (not shown). As a result, a ventilation hole 11 is formed in the electrode plate 10.

The laser beam 20 is a short-wavelength pulse laser having a wavelength within a range of 200 nm to 600 nm and has a high energy density. Therefore, a thermally-affected zone formed in a workpiece is small and precise machining is possible. Accordingly, by using such a laser beam 20, it is possible to suppress the formation of the thermally-affected zone and it is also possible to form a ventilation hole 11 having a smooth inner surface and a small machining-damaged layer (thermally-affected zone) with a high working precision. As a result, it is not necessary to perform a step of forming pilot holes or a step of machining the inner surfaces in the conventional techniques, and it is possible to form ventilation holes 11 by a single step; and thereby, high productivity can be achieved.

The focus spot 21 of the laser beam 20 can be swirled (turned around) by an optical system (not shown) using a wedge prism or the like. Thereby, as shown in FIG. 4, a locus (trajectory) of the laser beam 20 forms, for example, a parallel beam having a diameter of 200 μm. Therefore, a ventilation hole 11 without any taper can be formed.

By swirling (turning around) the irradiation area 22 due to an optical system, the irradiation area 22 can be moved circularly relative to the electrode plate 10. In the alternative, by moving (swaying) a table (not shown) having the electrode plate 10 fixed thereto in the xy direction, the irradiation area 22 can be moved circularly relative to the electrode plate 10.

By moving (forward and backward) an irradiation unit (not shown) of the laser beam 20 in the z direction (in the direction perpendicular to the surface 10a of the electrode plate 10) relative to the electrode plate 10, the focus spot 21 of the laser beam 20 can be moved relatively in the thickness direction of the electrode plate 10. In the alternative, by moving (forward and backward) the table having the electrode plate 10 fixed thereto in the z direction, the focus spot 21 of the laser beam 20 can be moved relatively in the thickness direction of the electrode plate 10.

In this way, by moving the electrode plate 10 and the laser beam 20 relatively so as to move forward the irradiation area 22 of the laser beam 20 spirally in the thickness direction relative to the electrode plate 10, it is possible to form the ventilation hole 11.

In the above-mentioned method for forming ventilation holes according to the embodiment of the invention, the irradiation area 22 of the laser beam 20 in the form of a parallel beam is moved forward spirally in the thickness direction relative to the electrode plate 10. Thereby, it is possible to form a ventilation hole 11 (a precise ventilation hole 11 of which a diameter difference between an entrance side and an exit side of the laser beam 22 is small) of which the diameter is almost the same in front and rear surfaces of the electrode plate 10. Such a ventilation hole 11 can be formed by a single step without forming a pilot hole.

The invention is not limited to the embodiment, but various modifications may be made thereto in detailed configuration without departing from the invention. For example, the material of the electrode plate 10 is not limited to silicon carbide, but monocrystalline silicon may be used. The forming conditions are appropriately adjusted depending on the material and the thickness of the electrode plate 10, the diameter of the ventilation holes 11 to be formed, and the like. Thereby, it is possible to form ventilation holes having a high shape precision. Particularly, as described above, it is preferable that the forward moving speed of the laser beam, the amount of machining per unit time, or the like is appropriately adjusted.

Industrial Applicability

In the method for forming ventilation holes in an electrode plate for a plasma processing apparatus according to the embodiment of the invention, a laser beam is used; and thereby, it is possible to form ventilation holes having a smooth inner surface and a small machining-damaged layer with a high machining precision. For example, the working precision of a pattern formed on a wafer by a plasma etching apparatus depends on the smoothness and the working precision of the inner surfaces of the ventilation holes in the electrode plate mounted on the plasma etching apparatus. Accordingly, the electrode plate in which the ventilation holes are formed by the method for forming ventilation holes according to the embodiment of the invention can greatly contribute to improvement of the working precision of the plasma processing apparatus.

In addition, since the ventilation holes having smooth inner surfaces and small machining-damaged layers can be formed by a single step without forming pilot holes, it is possible to achieve high productivity.

Therefore, the method for forming ventilation holes in an electrode plate according to the embodiment of the invention can be suitably applied to a process of manufacturing an electrode for a plasma processing apparatus.

Brief Description of Reference Signs

10: ELECTRODE PLATE
10a: SURFACE
11: VENTILATION HOLE
20: LASER BEAM
21: FOCUS SPOT
22: IRRADIATION AREA

The invention claimed is:
1. A method for forming ventilation holes in an electrode plate, comprising:
  a roughening step of roughening a surface of an electrode plate for a plasma processing apparatus such that a center line average roughness Ra becomes in a range of 0.2 μm to 30 μm; and
  a ventilation hole forming step of irradiating a laser beam having a wavelength within a range of 200 nm to 600 nm on a roughened surface of the electrode plate so as to form ventilation holes in the electrode plate which pass through the electrode plate in a thickness direction,
  wherein in the ventilation hole forming step, a focus spot of the laser light is swirled along a planar direction of the electrode plate so as to form a circular irradiation area, and while moving the circular irradiation area along a planar direction of the electrode plate in a circular movement, the focus spot of the laser light is shifted in a thickness direction of the electrode plate.

* * * * *